April 20, 1954 D. S. BOND ET AL 2,676,260

FREQUENCY CONTROL SYSTEM

Filed Dec. 3, 1949 2 Sheets-Sheet 1

INVENTORS
Donald S. Bond
Donald G. Moore
BY Barry Tunick
ATTORNEY

INVENTORS
Donald S. Bond
Donald G. Moore
BY Barry Tunick
ATTORNEY

Patented Apr. 20, 1954 2,676,260

UNITED STATES PATENT OFFICE 2,676,260

FREQUENCY CONTROL SYSTEM

Donald S. Bond and Donald G. Moore, Princeton, N. J., assignors to Radio Corporation of America, a corporation of Delaware Application December 3, 1949, Serial No. 130,964

11 Claims. (Cl. 250—36)

This invention relates to frequency control systems, and more particularly to systems for automatically maintaining the frequency of an oscillator exactly equal to that of a reference oscillator.

This invention constitutes an improvement over the arrangement disclosed in the copending Bond application, Serial No. 132,153, filed December 9, 1949, which ripened on June 30, 1953, into Patent No. 2,644,138. In said copending application, there is disclosed a system for synchronizing a controlled oscillator with a reference oscillator, such system utilizing a more or less conventional balanced modulator employing the usual transformer or transformers for securing push-pull and push-push inputs to the detectors or rectifiers of the modulator. Such an arrangement becomes less and less suitable as the frequency is raised, so that at radio frequencies of the order of 100 megacycles or higher other methods are desirable or necessary.

Therefore, an object of this invention is to devise a suitable system for synchronizing an ultra-high frequency or super-high frequency oscillator with a reference oscillator.

Another object is to devise a system for so synchronizing an ultra-high frequency or super-high frequency oscillator with a reference oscillator as to maintain a definite predetermined phase relation between the oscillator outputs.

A further object is to devise a frequency control system in which a controlled oscillator is synchronized with a reference oscillator and wherein the electrical coupling between such oscillators can be made negligible.

A still further object is to provide a balanced modulator capable of being properly matched to the two oscillators of a frequency control system utilizing controlled and reference oscillators.

Yet another object is to provide a wide-band balanced modulator in a frequency control system employing controlled and reference oscillators.

The foregoing and other objects of the present invention will be best understood from the following description of some exemplifications thereof, reference being had to the accompanying drawings, wherein.

The objects of this invention are accomplished, briefly, in the following manner:

Signals from the reference and the controlled oscillators are fed into a radio frequency bridge or hybrid balanced circuit, termed a diplexer, through the operation of which push-pull and push-push outputs are obtained, and thence to the rectifiers of a balanced detector or balanced modulator circuit. In this way, isolation between the two source oscillators is achieved, while the combination of the circuit and the rectifiers performs the function of a balanced modulator. An amplifier and a control means, associated with the controlled oscillator, provide means for securing synchronism and phase-locking of the two oscillators. Several alternative R. F. circuit arrangements are disclosed herein.

Figures 1, 2:
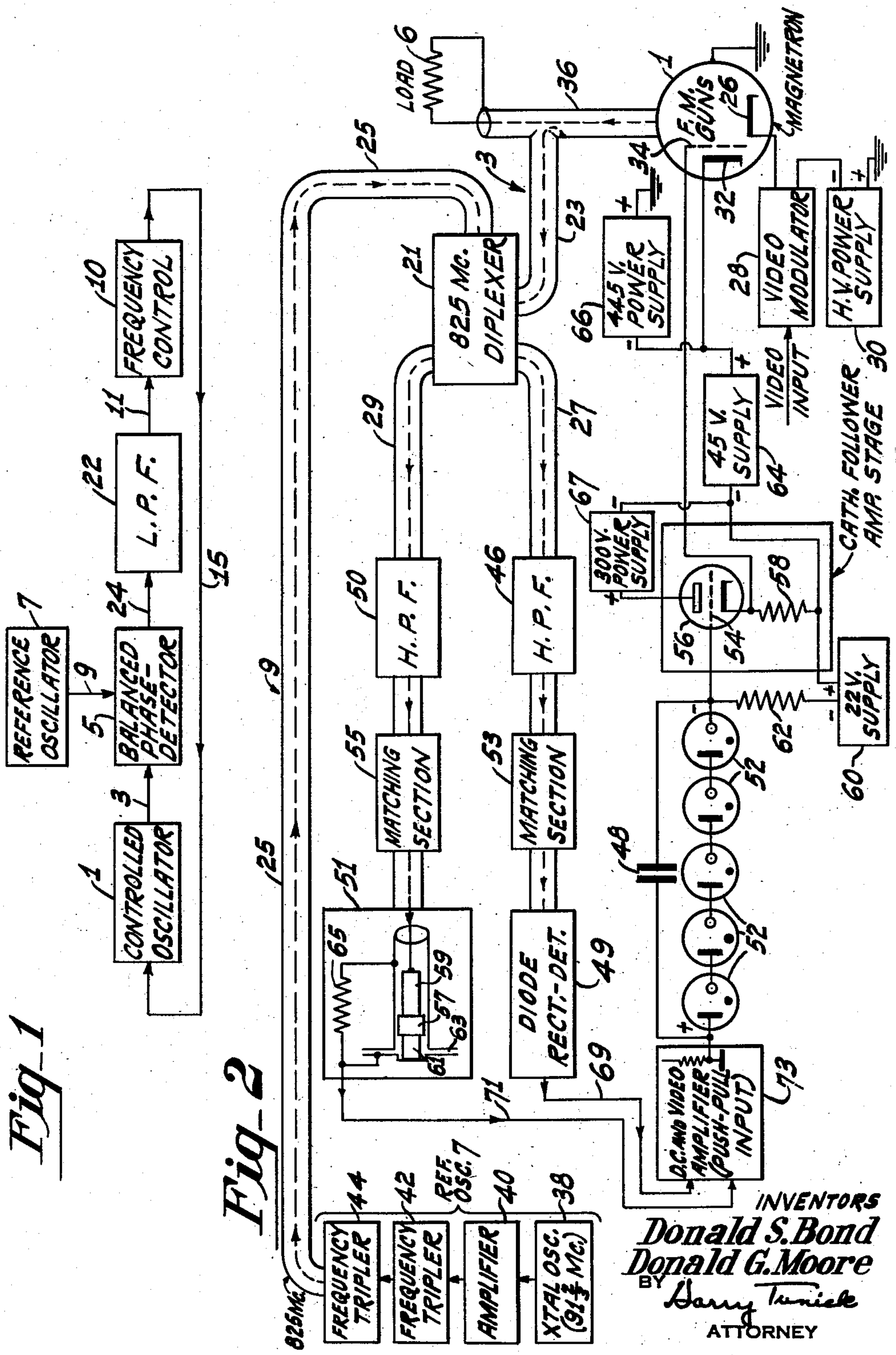
Fig. 1 is a block diagram illustrating a frequency control system to which this invention is applicable.
Fig. 2 is a schematic diagram of a practical frequency control and phase-locking system according to this invention.

Referring now to Fig. 1, controlled oscillator 1 has a portion of its output applied by path 3 to a balanced phase detector 5. Reference oscillator 7 has its output similarly applied by path 9 to phase detector 5. Output signals from detector 5 are fed by connection 24 through a low pass filter 22 and thence by path 11 to a frequency control means 10, which in turn is connected by connection 15 to appropriate input terminals of oscillator 1. It may be noted that in certain types of oscillators the parts 1, 10 and 15, shown separately, actually are indistinguishable parts of the same device, as for example in a reflex klystron. The description that follows is not changed, as applied to such oscillators, in any salient respect inasmuch as connections 3 and 11 remain accessible for all systems of this invention.

Although the filter unit 22 has been described as being "low pass," it is desired to be made clear that the term "low" is only relative, and that such filter is "low pass" only when referred to the output frequency of oscillator 1. Actually, unit 22 faithfully transmits all frequencies from zero up to a video frequency such as two or three megacycles.

As disclosed in the aforementioned Bond application, an output signal from reference oscillator 7 is fed in push-pull to the two rectifiers included in balanced phase detector 5, while an output signal from controlled oscillator 1 is fed in push-push to such two rectifiers. Voltages are developed by phase detector 5 whenever the output frequencies of oscillators 1 and 7 are unequal and whenever the relative phase of such outputs differs from 90 degrees. The phase detector 5 operates as disclosed in Pomeroy Patent 2,288,025, dated June 30, 1942, and in the copending Beard et al. application, Serial No. 56,974, filed October 28, 1948. Said Beard et al. application ripened on February 5, 1952, into Patent #2,584,780. The voltages appearing in the output of detector 5 act via 22 to cause the frequency control 10 to maintain the controlled oscillator 1 in synchronism with reference oscillator 7 and at a 90 degree relative phase therewith. This frequency control action will become clearer as the description proceeds.

If desired, the reference oscillator 7 may be frequency modulated, thereby producing by the control system of this invention corresponding frequency modulation of the controlled oscillator 1, as disclosed in the aforementioned Bond application; alternatively, as disclosed in Fig. 2 herein, the reference oscillator 7 may be a stable crystal-controlled oscillatory source, the control system of this invention then being used for phase-locking or automatic frequency control of oscillator 1.

Fig. 2 illustrates somewhat schematically a practical phase-locking or frequency control system according to this invention, in which the oscillator 1 to be synchronized to a reference oscillator, or to be frequency stablized or phase-locked such that a definite phase relation is maintained between the outputs of the reference and controlled oscillators, is in the ultra-high frequency or super-high frequency range; such an oscillator 1 is illustrated as being a magnetron. Magnetron 1 has a conventional cathode 26 (the outer shell of the magnetron being grounded as shown) which is connected through a video modulator 28 to the negative terminal of a high voltage power supply 30 the positive terminal of which is grounded. Video input is applied to modulator 28 to plate modulator magnetron 1 in an amplitude modulation manner. The magnetron 1 preferably has embodied therein a plurality of frequency control means known as "FM guns," only one of which is indicated in Fig. 2, but each of which consists of an electron-emitting cathode 32 and an electron flow control element 34. By the application of a suitable bias voltage between cathodes 32 and elements 34, the output frequency of magnetron 1 may be controlled. For a more complete disclosure of such frequency control means, reference is made to the copending but now abandoned Smith application, Serial No. 563,732, filed November 16, 1944. In an embodiment of this invention actually built and tested, magnetron 1 had an output frequency of 825 mc., as indicated in Fig. 2.

Magnetron 1 feeds a suitable load 6, which may for example be a transmitting antenna, by means of a feed line 35. A small portion of the output of magnetron 1 is taken off by a transmission line 23 and fed as one of the inputs to a diplexer 21, to be later described. Diplexer 21 serves to make the electrical coupling between the reference and controlled oscillators negligible, while at the same time serving as a means to secure push-pull (antiphasal) and push-push (cophasal) inputs to the detectors or diode rectifiers of a balanced phase detector. It has been found that the balanced phase detector disclosed in the aforementioned Bond application, utilizing or employing as it does a transformer, becomes less and less suitable as the frequency is raised, so that at radio frequencies on the order of 100 mc. or higher, other coupling arrangements are desirable or necessary. Consequently, the diplexer 21 is utilized to provide push-push and push-pull inputs to the rectifiers of the phase detector from the controlled and reference oscillators, in order to provide a balanced phase detector. Line 23, which constitutes path 3, provides input from controlled oscillator 1 to diplexer 21.

Reference oscillator 7, which in Fig. 2 is a stable oscillator, consists of a plurality of units connected in cascade, these units being a crystal oscillator 38 operating at 91⅔ mc., an amplifier 40, a first frequency tripler 42 and a second frequency tripler 44 which provides a frequency of 825 mc. as its output. The output of tripler 44, which serves as the output of the reference oscillator 7, is applied as the reference oscillator input to diplexer 21 by means of a suitable transmission line 25 which constitutes path 9.

One of the output connections 27 of diplexer 21 applies power through a suitable high-pass filter 46 and matching section 53 to a detector circuit 49, while the other output connection 29 of said diplexer applies power through a similar high-pass filter 50 and matching section 55 to a detector circuit 51. The matching sections 53 and 55 may consist of double-stub tuners or other suitable matching units. If double-stub tuners are used, these units are adjusted in a well-known manner so that each presents an input impedance R (the impedance of circuits 49 and 51) when detectors 49 and 51 are connected as shown in Fig. 2.

One of the detector units, for example 51, will be described in more detail. It includes a rectifier 57 consisting of anode 59 and heated cathode 61 of a coaxial diode like that manufactured by applicants' assignee and designated R6271C. Alternatively, a crystal detector such as that manufactured commercially and designated 1N21B may be substituted here, in an obvious manner.

Capacitor 63, of low impedance at signal frequency, serves as the R. F. return circuit for the rectifier. The D. C. or video-frequency rectifier load consists of resistor 65. Parts 63 and 65 comprise part of the low-pass filter 22 in Fig. 1.

The two load resistor, 65 and a similar resistor (not shown) in circuit 49, are connected by conductors 71 and 69 to the balanced or push-pull input of a D. C. and video amplifier 73. The characteristics of this amplifier are such that frequencies from zero up to an audio or video frequency are transmitted and amplified. The design of amplifier 73 is more or less conventional. If desired, the two rectifier load resistors may be included at the input end of amplifier 73, as a part of such amplifier.

The output of amplifier 73 is applied to a plurality, here shown as five, of series-connected voltage regulator glow tubes 52 across which is connected a condenser 48. These tubes 52 in effect serve the same purpose as a battery, to provide a more or less constant voltage thereacross, which voltage has the polarity indicated. The negative end of the array of tubes 52 is connected to the grid 54 of a triode 56 connected as a cathode follower amplifier stage, a cathode resistor 58 being connected between the cathode of tube 56 and a point of fixed potential, in the usual manner. Bias supply 60 has the positive terminal thereof connected to the lower end of resistor 58 and its negative terminal connected to grid 54 through a resistor 62, to provide proper grid bias for the cathode follower stage. A 300-volt power supply 67 furnishes operating or plate potential for tube 56.

The upper end of load resistor 58 is connected directly to the control elements 34 of the FM guns in magnetron 1, while the lower end of such resistor is connected through a suitable bias voltage supply 64 to the cathodes 32 of such guns. In this way, the voltage across load resistor 58 is effectively applied between the cathodes 32 and control elements 34 of the FM guns as a variable or controllable bias voltage for such guns, to produce changes in output frequency of magnetron 1 in response to the appearance of a voltage across resistor 58. The proper anode potential for the FM guns is provided by means of a source of potential 66 the positive terminal of which is grounded (as is the magnetron envelope) and the negative terminal of which is connected to FM gun cathodes 32.

The units and circuit components between amplifier 73 and magnetron 1 in Fig. 2 correspond to the frequency control means 10 and connection 15 in Fig. 1. The output of the balanced phase detector 21, 27, 29, 46, 50, 53, 55, 49 and 51 may consist of alternating or direct voltages or both, and these voltages appearing across resistor 58 control, by means of the FM guns, the output frequency of magnetron oscillator 1 to maintain it exactly equal to the output frequency of reference oscillator 7 and at a fixed relative phase (90 degrees) therewith.

The mode of operation of the system of Fig. 1, including balanced phase detector 5, has been described in the aforementioned Bond application. The improvements that distinguish the present invention over said Bond application will now be described in connection with Figs. 3, 4 and 5.

Figure 3:
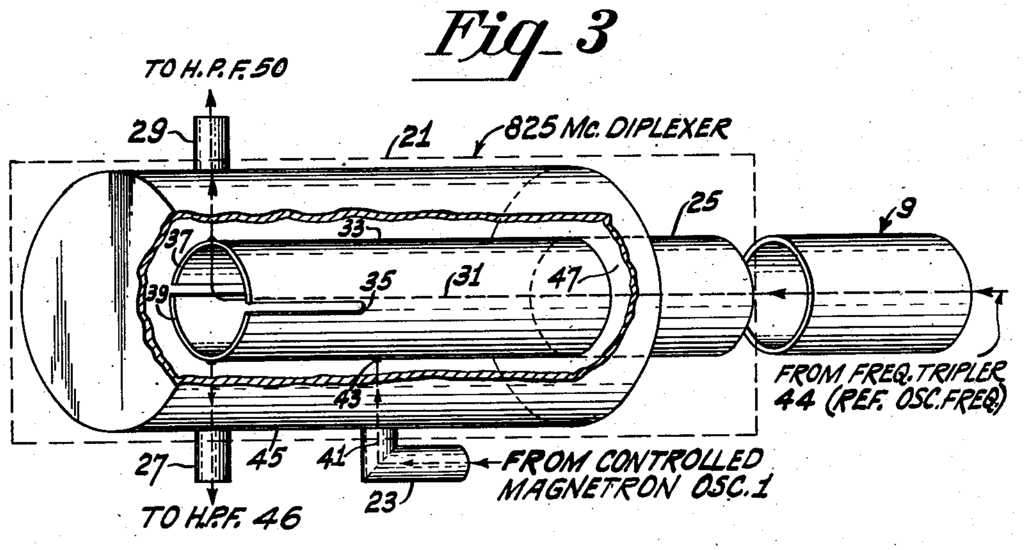
Figs. 3–5 are detailed illustrations of several alternative diplexers useful in the system of Fig. 2.

In Fig. 3, parts similar to those of Fig. 1 are denoted by the same reference numerals. Fig. 3 is a rather detailed showing of a preferred form of diplexer 21 usable in the system of Fig. 2 and which may take the place of the transformer-coupled input arrangement of the phase detector of the said Bond application, for use at ultra-high frequencies or super-high frequencies. It will become apparent that the unit 21 of Fig. 3 consists of coaxial elements so arranged that isolation between the oscillatory sources is obtained, while at the same time achieving push-push and push-pull couplings to the rectifiers, as desired. Two input circuits 23 and 25 receive signals from oscillators 1 and 7 respectively and are arranged to be conjugate to each other, so that essentially no power applied to 23 is transferred to 25 and vice versa. Two output connections 27 and 29 receive power from both inputs 23 and 25.

It is essential to the operation of the device that the waves appearing at corresponding points of 27 and 29 be in phase when signal is applied to 23 (that is, that signal applied to 23 appear push-push or cophasally at the output connections), and that the waves appearing at corresponding points of 27 and 29 be of opposite phase when signal is applied to 25 (that is, that signal applied to 25 appear push-pull or antiphasally at the output connections). These requirements are met in diplexer 21 of Fig. 3.

The center conductor 31 of input 25 has the corresponding coaxial outer conductor 33. Conductor 33 is slotted from point 35 to the ends 37, 39 thereof, the length of the slot being approximately ¼ wavelength at the operating frequency of 825 mc. Inner conductor 31 connects to end 37. This is a well-known means for transforming from an unbalanced coaxial circuit to a balanced coaxial circuit and is commonly called a "balun." By reason of the above-described arrangement, ends 37 and 39 are excited in phase opposition or in push-pull from input 25 or from reference oscillator 7.

Inner conductor 41 of input 23 is attached to conductor 33 at point 43. Conductor 33 serves as the inner conductor of a coaxial circuit in conjunction with outer conductor 45. Two circuits are seen by an observer looking in at point 43. The first, comprising the inner conductor 33 from point 43 to short-circuiting disc 47, which is a direct metallic connection between conductors 33 and 45, together with the corresponding outer conductor 45, is a coaxial element approximately ¼ wavelength long at the operating frequency. Since it is short-circuited by 47 it presents a very high impedance at point 43 and therefore its effect on the circuit 23 to which it is connected may be neglected.

The coaxial circuit including the portion of conductor 33 extending from point 43 to 37 and 39 behaves as if no slot were present, since only axial currents flow. This portion of the circuit (from 43 to 37 and 39) is likewise approximately ¼ wavelength long at the operating frequency, but is not short-circuited as is the other or right-hand half of conductor 33. Cophasal or push-push voltages appear at ends 37 and 39 due to input at 23 from controlled oscillator 1. Output connection 27 is coupled to end 39, while output connection 29 is coupled to end 37.

For a somewhat more detailed description of the diplexer 21 of Fig. 3, reference is made to Brown Patent 2,454,907, dated November 30, 1948.

While the dimensions including the relative diameters of inner and outer conductors of the coaxial circuits comprising diplexer 21 have not been described herein, methods are well-known for transforming the impedances properly for matching purposes. We prefer to adjust the impedances of the various portions in such a manner that when resistive terminations each of magnitude R are connected to outputs 27 and 29 the impedance measured at either 23 or 25 will also be R.

The circuit arrangement of diplexer 21 may be compared with that of the circuit of Fig. 2 of the said Bond application. Transformer 13 of Bond has as its equivalent herein the system comprising parts 31, 33 of Fig. 3. Likewise, input from 12 of Fig. 2 of Bond has as its equivalent, in Fig. 3 herein, parts 23, 33 and 45 connected to source 1. It is obvious from symmetry that oscillators 1 and 7 may be interchanged at will.

Figures 4, 5:
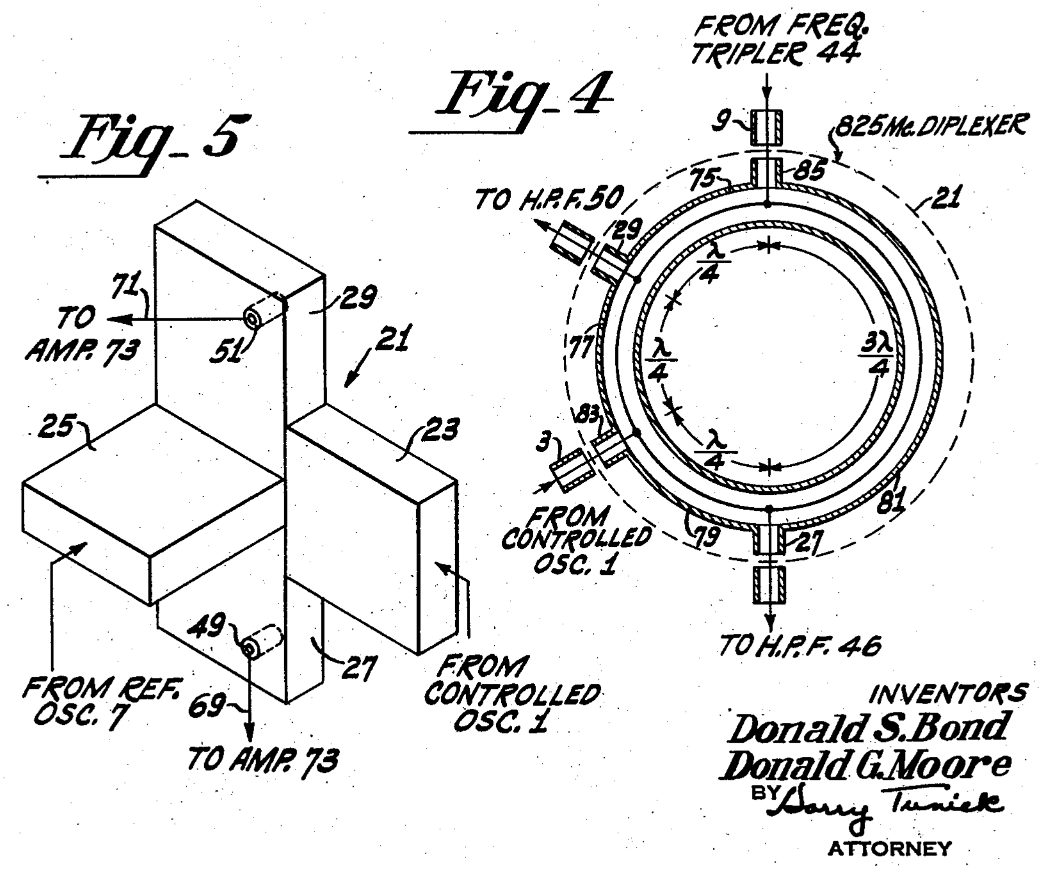

An alternative arrangement including a ring-type R. F. circuit for balanced phas edetector 5 is illustrated in Fig. 4, in which parts functionally similar to those of Figs. 1, 2 or 3 have the same reference numerals. The diplexer 21 of Fig. 4 is a ring made up of coaxial conductors 75, 77, 79 and 81. Conductors 75, 77 and 79 are each approximately ¼ wavelength long, while conductor 81 is ¾ wavelength long, measured in each case at the nominal operating radio frequency.

Inputs 83 and 85 stand in conjugate relationship to each other since one is connected to the other by two paths 77, 75 and 79, 81 respectively; these two paths differ in length by ½ wavelength. If there is appreciable attenuation in the conductors it may be necessary to incorporate attenuators in 75 or 77 to equalize the losses around the two paths.

Signals entering 83 from oscillator 1 arrive at the detectors coupled to high-pass filters 50 and 46 in the same phase, since conductors 77 and 79 have the same length. It will be noted that 83 and 27 are coupled by two paths (79 and 77, 75, 81) differing by a whole wavelength and hence the component signals from 83 reinforce each other at 27. Similarly, 83 and 29 are coupled by two paths (77 and 79, 81, 75) differing by a whole wavelength; hence the component signals from 83 reinforce each other at 29. Furthermore, 85 is coupled to 27 by two paths (81 and 75, 77, 79) each of ¾ wavelength, while 85 is coupled to 29 by path 75 of ¼ wavelength, so that signals entering 85 from tripler 44 (of oscillator 7) arrive at outputs 27 and 29 with a phase difference of 180 degrees because of the additional ½ wavelength path which must be traversed between 85 and 27, as compared to that between 85 and 29. The path 81, 79, 77 between 85 and 29 differs in length from path 75 by a whole wavelength, so that the component signals from 85 reinforce each other at 29. Thus, diplexer arrangement 21 of Fig. 4 behaves in a similar manner to the corresponding arrangement of Fig. 3.

In another alternative arrangement, particularly suitable for the frequency range in which wave guides are commonly employed, a wave guide hybrid junction, sometimes called a "magic T," is substituted for parts 21 and 46, 50, 53, 55, 49, 51 of the previously described arrangements. This is illustrated in Fig. 5, with parts having the same function as the previously-described parts appropriately designated. In Fig. 5, input guides 23 and 25 are conjugate to each other, while each can feed signals to detectors 49, 51 in wave guides 27, 29. Considerations of the odd and even symmetry of the hybrid junction show that one input produces signals which are cophasal at detectors 49, 51 while the other produces signals which are antiphasal or in phase opposition at such detectors. Well-known means for matching the detectors to the wave guides may be employed.

For a somewhat more detailed explanation of the operation of the "magic T" as a mixer, reference may be had to Bruck et al. Patent 2,462,841, dated March 1, 1949.

Still other arrangements for diplexer or hybrid unit 21 are well-known and are described, for example, in an article entitled "Hybrid Circuits for Microwaves," by W. A. Tyrrell, appearing in Proceedings of the IRE, volume 35, page 1,294, November, 1947.

What we claim to be our invention is as follows:

1. A frequency control system comprising a source of oscillatory energy the frequency of which is to be controlled, a source of oscillatory energy of stable frequency, a diplexer unit having a plurality of intercoupled ultra-high frequency wave transmission members terminating with a pair of conjugate input couplings and a pair of output couplings, means for supplying oscillatory energy of only said controlled frequency from said first-named source to one of said input couplings, means coupling the second-named source to the other input coupling, thereby to supply oscillatory energy of only said stable frequency to said other input coupling, means for controlling the frequency of said first-named source from said two output couplings, said output couplings having therein energy 180° out of phase and other energy in phase, said last-named means having two branches each including therein a high pass filter and having therein only circuits whose bandwidths are large in comparison with the spectrum of the significant energy components of the wave impressed on said circuits, said last-named means including a rectifier coupled to each of said output couplings, an output load coupled to each of said rectifiers, and means for applying the voltages developed across said output loads to said first-named source to vary the frequency thereof, whereby the accuracy of the frequency control effected by said system is rendered substantially independent of temperature.

2. A frequency control system in accordance with claim 1, wherein the wave transmission members are coaxial transmission lines.

3. A frequency control system in accordance with claim 1, wherein the wave transmission members are waveguides.

4. A frequency control system in accordance with claim 1, wherein the diplexer is constructed and arranged to supply oscillatory energy from one of said sources cophasally to said rectifiers and oscillatory energy from the other of said sources antiphasally to said rectifiers, and wherein the wave transmission members are coaxial transmission lines.

5. A frequency control system comprising a source of oscillatory energy the frequency of which is to be controlled, voltage-responsive means operative to control the frequency of said source, a source of oscillatory energy of stable frequency, a diplexer unit having a plurality of intercoupled ultra-high frequency wave transmission members terminating with a pair of conjugate input couplings and a pair of output couplings, means for supplying oscillatory energy of only said controlled frequency from said first-named source to one of said input couplings, means coupling the second-named source to the other input coupling, thereby to supply oscillatory energy of only said stable frequency to said other input coupling, means for controlling the frequency of said first-named source from said two output couplings, said output couplings having therein energy 180° out of phase and other energy in phase, said last-named means having two branches each including therein a high pass filter and having therein only circuits whose bandwidths are large in comparison with the spectrum of the significant energy components of the wave impressed on said circuits, said last-named means including a rectifier coupled to each of said two output couplings, a separate output load coupled to each of said rectifiers, and means for applying the voltages developed across each of said two output loads to said voltage-responsive means to control the frequency of said first-named source, whereby the accuracy of the frequency control effected by said system is rendered substantially independent of temperature.

6. A frequency control system in accordance with claim 5, wherein the wave transmission members are coaxial transmission lines.

7. A frequency control system in accordance with claim 5, wherein the first-named source is a magnetron.

8. A frequency control system in accordance with claim 5, wherein the first-named source is a magnetron and wherein the wave transmission members are coaxial transmission lines.

9. A frequency control system in accordance with claim 5, wherein the diplexer is constructed and arranged to supply oscillatory energy from one of said sources cophasally to said rectifiers and oscillatory energy from the other of said sources antiphasally to said rectifiers, and wherein the wave transmission members are coaxial transmission lines.

10. A frequency control system in accordance with claim 5, wherein the diplexer is constructed and arranged to supply oscillatory energy from one of said sources cophasally to said rectifiers and oscillatory energy from the other of said sources antiphasally to said rectifiers, and wherein the wave transmission members are waveguides.

11. A frequency control system in accordance with claim 5, wherein the diplexer is constructed and arranged to supply oscillatory energy from one of said sources cophasally to said rectifiers and oscillatory energy from the other of said sources antiphasally to said rectifiers, wherein the first-named source is a magnetron, and wherein the wave transmission members are coaxial transmission lines.

References Cited in the file of this patent

UNITED STATES PATENTS

| Number | Name | Date |
|---|---|---|
| 2,410,817 | Ginzton et al. | Nov. 12, 1946 |
| 2,436,828 | Ring | Mar. 2, 1948 |
| 2,445,895 | Tyrrell | July 27, 1948 |
| 2,445,896 | Tyrrell | July 27, 1948 |
| 2,454,907 | Brown | Nov. 30, 1948 |
| 2,455,393 | Varian | Dec. 7, 1948 |
| 2,462,841 | Bruck et al. | Mar. 1, 1949 |
| 2,468,166 | Bruck | Apr. 26, 1949 |
| 2,475,474 | Bruck et al. | July 5, 1949 |
| 2,486,001 | Bruck et al. | Oct. 25, 1949 |